United States Patent [19]

Waller

[11] Patent Number: 4,672,581
[45] Date of Patent: Jun. 9, 1987

[54] REPAIRABLE MEMORY ARRAY

[75] Inventor: David L. Waller, Bristol, England

[73] Assignee: Inmos Limited, Bristol, England

[21] Appl. No.: 603,619

[22] Filed: Apr. 25, 1984

[30] Foreign Application Priority Data

Feb. 8, 1984 [GB] United Kingdom ................. 8403292

[51] Int. Cl.⁴ ....................... G11C 13/00; G11C 11/40
[52] U.S. Cl. ..................................... 365/200; 365/189
[58] Field of Search ............................... 365/189, 200

[56] References Cited

U.S. PATENT DOCUMENTS

| | | | |
|---|---|---|---|
| 4,428,068 | 1/1984 | Baba | 365/200 |
| 4,453,248 | 6/1984 | Ryan | 365/200 |
| 4,520,453 | 5/1985 | Chow | 365/200 |
| 4,532,611 | 7/1985 | Countryman, Jr. | 365/200 |

Primary Examiner—Terrell W. Fears
Attorney, Agent, or Firm—Edward D. Manzo; Roger R. Wise

[57] ABSTRACT

The columns of a memory array are accessed by a plurality of column decoders, each decoder selectively accessing one column in a respective group of columns. Each column decoder can be connected to a respective data line by way of a first transistor, and the data line can also be connected to the decoder of a preceding group of columns by way of a second transistor. The second transistor associated with the first stage can connect the first data line to a spare column decoder accessing a spare group of columns.

The conditon of each pair of first and second transistors is controlled by way of a respective normally closed fuse, and generally each column decoder is connected by its first transistor only to its respective data line. However, if defects are found in a group of columns, the associated fuse is blown to isolate that group from its data line. The second transistor is then rendered conductive to connect the data line to the preceding column decoder. Similarly, the data line of each preceding group is connected to the preceding column decoder with the first data line being connected to the spare column decoder.

26 Claims, 4 Drawing Figures

REPAIRABLE MEMORY ARRAY

BACKGROUND TO THE INVENTION

The present invention relates to a memory circuit and to a method of replacing a column of a memory array.

It is known to make memory circuits tolerant of defects, for example, by providing spare memory locations for substitution into the memory array for any defective locations. For example, GB-A-1550 675 describes a system in which individual cells of a spare memory row or column can be substituted for defective cells of a memory array. In this system, the address of each defective cell is stored such that when it is required to address that defective cell, a replacement cell is addressed in its stead. GB-A-1398438 and 1455716 also describe systems where replacement locations are addressed instead of locations known to be defective. However, in GB-A-1398438 a defective row of the array is replaced by a spare row whilst in GB-A-1455716 a defective sector is replaced by a spare sector.

In addition, an EPROM with a nine block cell array which can be used as an 8 bit memory with the ninth block providing a redundant block is described in "A 288K CMOS EPROM with redundancy" by M. Yoshida et al, pages 544–549 of IEEE Journal of Solid-State Circuits, Vol SC-18, No. 5, October 1983.

Until recently, microprocessors in particular have operated using relatively small data words, for example, of 8 bits or less and the memory arrays therefore have been kept quite narrow. As the width, that is the number of columns, of a memory array is increased, it becomes more difficult to provide for access to the array such that each location can be accessed in substantially the same time and such that each location "looks" substantially the same to the processor. Because of this, any redundancy has previously been provided as spare rows to replace rows of the array.

SUMMARY OF THE INVENTION

It is an object of the present invention to provide a memory circuit including column redundancy.

According to a first aspect of the present invention there is provided a memory circuit comprising a memory array having a plurality of rows and columns, a plurality of column decoders for enabling access to columns in said array, each column decoder being associated with a respective group of said columns and being arranged to selectively access one of the columns in the respective group, and further comprising a spare group of memory columns and a further column decoder associated with said spare group of columns and arranged to selectively access one of the columns in said spare group, and logic means programmable to inhibit access to a selected group of said columns and to enable access to said spare group of columns.

Preferably, said logic means is arranged to connect each group of columns to a respective data line. Said logic means is also programmable to isolate said selected group of columns from its respective data line, and to connect the data line associated with said selected group of columns to the adjacent preceding group of columns, the spare group of columns constituting the adjacent preceding group of columns to the first group of columns.

In an embodiment, the spare group of columns is physically adjacent to the first group of columns in the memory array.

Thus, any selected group of columns which is found to be defective can be replaced by the adjacent preceding group of columns. In view of the proximity there is no significant increase in access time. Similarly, the data line of the replacement group is connected to the next preceding group and so on until the data line of the first group is connected to the spare group of columns.

In an embodiment, each row of the memory array is arranged to store more than one data word, only one data bit of each data word being stored in any one group of columns. Further, the number of columns in each group is equal to the number of data words to be stored in each row, and the number of groups of columns is equal to the number of data bits making up each data bits making up each data word. Correspondingly positioned bits of each data word are then stored in each group of columns.

Preferably, said logic means has a respective logic circuit associated with each group of columns of the memory array, each logic circuit comprising first programmable switch means arranged to connect the associated column decoder and the respective data line and second programmable switch means arranged to connect said respective data line and the column decoder associated with the adjacent preceding group of columns, the spare group of columns constituting the adjacent preceding group of columns to the first group of columns.

Each said logic circuit preferably includes a further programmable switch means, such as a fuse, arranged to control said first and second switch means. The further switch means normally controls first switch means to connect the associated group of columns to said respective data line, and normally controls the second switch means to isolate said respective data line from other groups of columns. The condition of the further switch means is used to represent whether or not the associated group of columns contains one or more defects.

To ensure that each data line is only connected to one group of columns, the further programmable switch means of each logic circuit is also arranged to control the condition of said first and second switch means of the next logic circuit associated with the adjacent preceding group of columns.

The first and second switch means of each logic circuit may be first and second transistors whose gates are connected to said further switch means, the gate of one of said transistors being connected to said switch means by way of an inverter.

The present invention also extends to a method of replacing a column of a memory array with a different memory column, where the memory array has a plurality of rows and columns, a plurality of column decoders are each associated with a group of columns in said array, and each said column decoder is arranged to selectively access one of the columns in the respective group, and where a spare group of memory columns and a further column decoder associated with said spare group are provided, said further column decoder being arranged to selectively access one of the columns in the spare group, the method comprising the steps of inhibiting access to a selected group of columns, and enabling access to the spare group of columns.

In an embodiment, where each group of columns of the array is normally connected to a respective data line by way of the associated column decoder, and wherein access to said selected group of columns is inhibited by isolating said group of columns from its respective data line, the method further comprises the steps of connecting the data line associated with the selected group of columns to the adjacent preceding group of columns, the spare group of columns constituting the adjacent preceding group of columns to the first group of columns. Further, any group of columns whose respective data line has been connected to the succeeding group of columns is connected to the data line of the adjacent preceding group of columns, and the data line of the first group of columns is connected to said spare group of columns, such that each data line is only connected to one group of columns.

In an embodiment providing increased levels of redundancy, two or more spare groups of columns are provided, and any group of columns whose respective data line has been connected to the succeeding group of columns is connected to the data line of a preceding group of columns, the data line of the first group of columns being connected to one of said spare groups of columns, such that each data line is only connected to one group of columns. Access to a plurality of selected groups of columns is inhibited by isolating each said selected group from its respective data line, the number of isolated selected groups being less than or equal to the number of spare groups.

BRIEF DESCRIPTION OF THE DRAWINGS

Embodiments of the present invention will hereinafter be described, by way of example, with reference to the accompanying drawings, in which.

DESCRIPTION OF A PREFERRED EMBODIMENT

Figure 1:
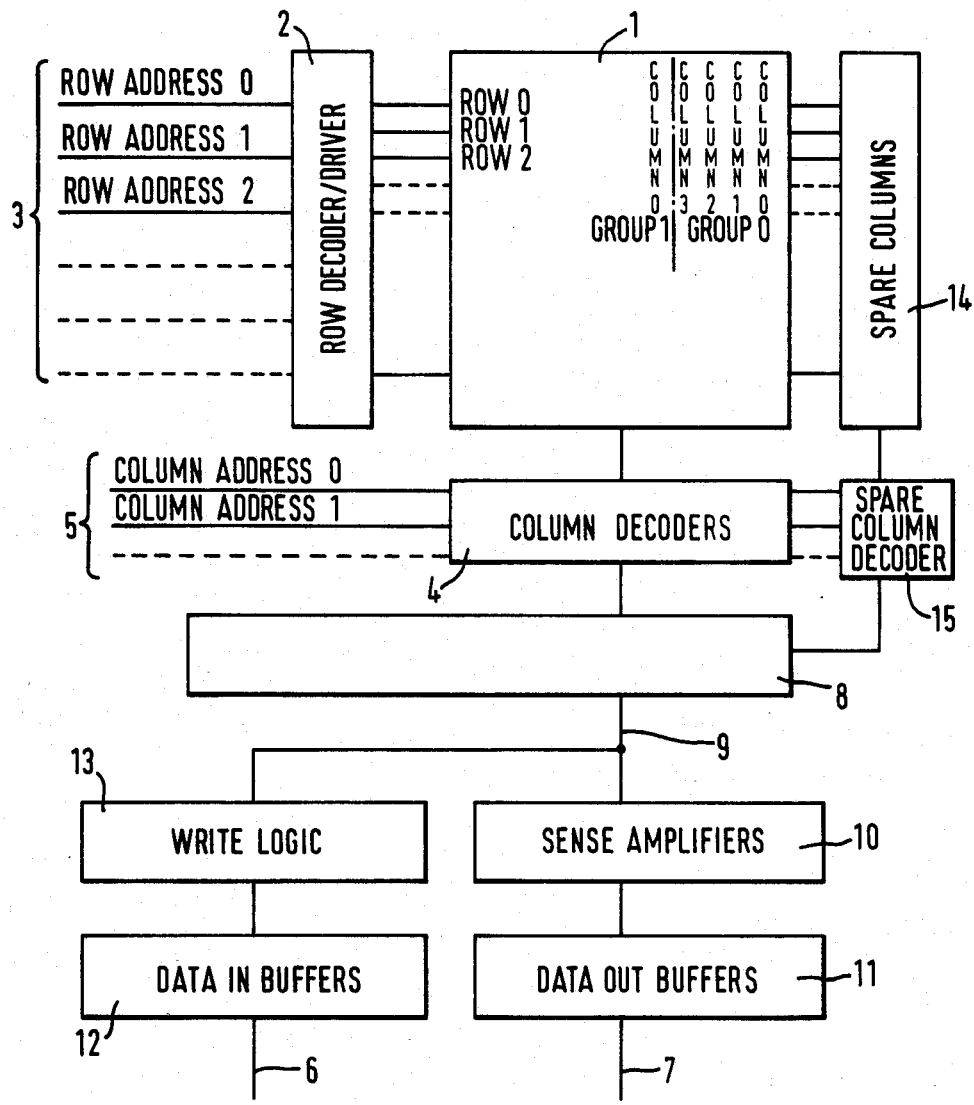
FIG. 1 shows an embodiment of a memory circuit including a memory array which may be repaired.

FIG. 1 shows a block diagram of a memory circuit including a random access memory (RAM) 1 and enabling the RAM to be repaired. In this embodiment, the RAM is an array having 16 rows and 4×16 columns. It is assumed that each word to be stored in the RAM will be 16 bits such that four words can be stored in each row of the RAM array 1.

Each row of the RAM array 1 is connected to a row decoder/driver 2 arranged to access an individual row of the RAM array 1 upon receipt of the appropriate multi-bit row address on the address lines 3.

Figure 2:
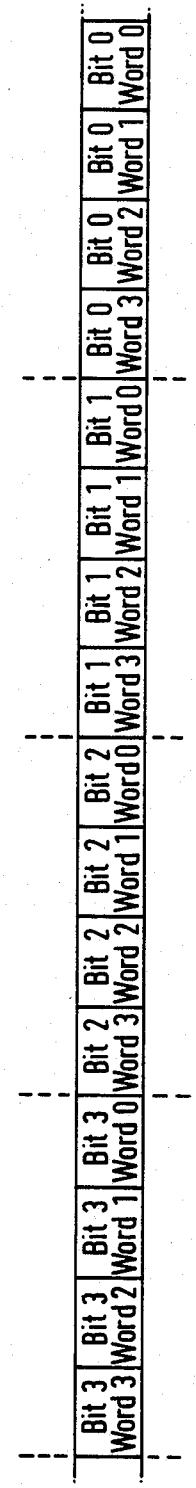
FIG. 2 shows schematically the arrangement of data bits in one row of the memory.

The data bits stored in the individual locations along each row are, in this embodiment, the bits of four 16 bit data words which are arranged in an interleaved manner as is illustrated in FIG. 2. Thus, FIG. 2 shows the first four bits of the four data words. As is apparent, the correspondingly positioned bits of all four data words are stored in each group such that at any one time it is only necessary to access one bit from each group of four bits. Thus, to access word 0 it is only necessary to access the most right hand bit of every group of four bits.

Column decoders 4 are provided to access the groups of columns in the RAM array 1. Each column decoder is associated with one group of columns and is arranged to selectively access one of the columns in the associated group. Preferably, the column decoders 4 are ganged switches such that when one decoder selects one column in its associated group, the other decoders similarly select the corresponding columns in their respective group. The address of a column to be accessed is fed to the decoders 4 by way of column address lines 5.

To access a word in the RAM array 1 it is necessary to put the row address of this word on the row address lines 3. However, it is then only necessary to put on the address lines 5 the address of one of the columns containing one bit of that word. Because the column decoders 4 are ganged together each column decoder will similarly access the corresponding column in its associated group such that every bit of the word on the accessed row will be accessed.

The memory circuit illustrated in FIG. 1 includes not only the address lines 3 and 5 but also input and output data lines 6 and 7. It is intended that the memory circuit of FIG. 1 would be used with a processor or other control unit (not shown) which would address the RAM array 1 to either output data on the output line 7 or input data on the input line 6 in normal manner in accordance with a program.

To read data, the words stored in the array 1 are accessed as described above and the data is connected by way of logic circuits 8 to a data bus 9. The data on the data bus 9 is then sensed by sense amplifiers 10 and buffered by data out buffers 11 in normal manner.

Similarly, to write data into the array 1, the word locations are accessed in the array 1 and the data to be written into those locations is presented to the data bus 9 from the data input line 6 by way of data in buffers 12 and write logic 13. This data will then be written from the data bus 9 into the accessed locations of the array 1 substantially as described above. In both the read and the write operations the data is fed by way of logic means 8.

The memory circuit shown in FIG. 1 also includes a group of spare columns 14. In this embodiment this group of spare columns will include four columns. A spare column decoder 15 is associated with the group of spare columns 14 and is connected to the column decoders 4 for ganged operation therewith. This spare group of columns 14 is connected to the RAM array 1 such that the rows thereof can be accessed by the row decoder/driver 2. Preferably, the spare memory columns 14 are the same type of memory as the RAM array 1.

Where any group of columns in the main RAM array 1 is found to contain one or more defects, it is intended that the defective group not be used, and instead that the spare columns be used. In the embodiment shown in FIG. 1, both the column decoders 4 and the spare column decoder 15 are connected to the data bus 9 by way of logic means 8. These logic means are arranged to prevent access to any group of the main array 1 which is found to contain defects and also to enable access to the spare group of columns 14. A schematic circuit diagram of the logic means 8 is shown in FIG. 3.

Figure 3:
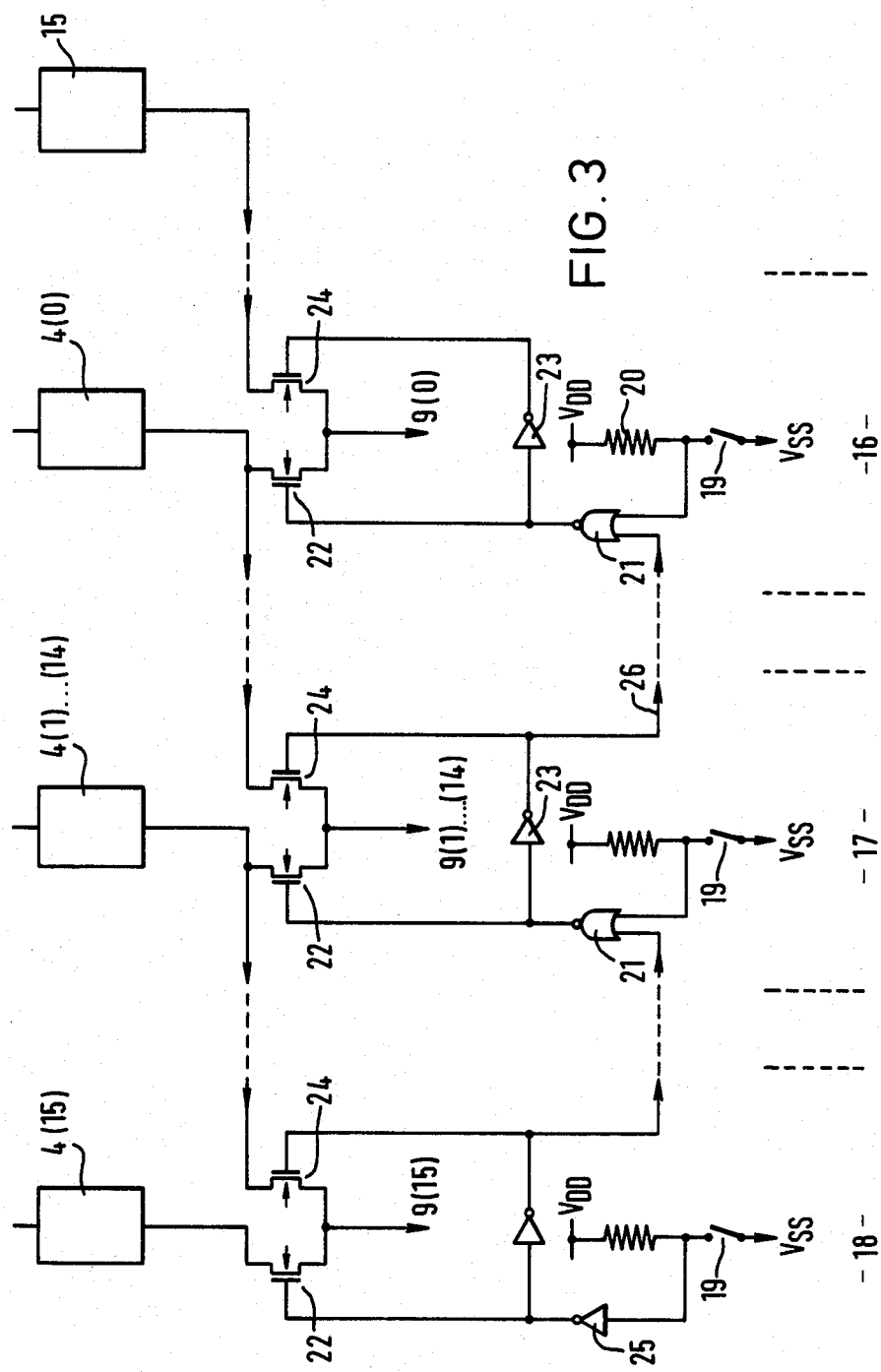
FIG. 3 shows one embodiment of logic means enabling repair of the memory.

In FIG. 3, the individual column decoders 4(0), 4(1), 4(2) ... 4(15), associated with each group of columns of the array 1 are represented. As explained above, each of these decoders 4, which are connected for ganged operation, is arranged to selectively access one of the four columns in the respective group. Similarly, the spare column decoder 15, which again is a 1 from 4 decoder, is shown in FIG. 3.

The logic means 8 comprises a number of substantially identical circuit stages, each stage being associated with a respective column decoder 4 and hence with one group of columns of the main array 1. The first stage 16 is connected between the column decoder 4(0) and a respective data line 9(0) of the data bus 9. Similarly, an intermediate stage 17 is asssociated with each of the intermediate decoders 4(1), (2), (3), ... (14) and hence with the associated group of columns in the array 1. Each intermediate stage 17 is the means by which the respective group of columns can be connected to the appropriate data line 9(1), (2) ... (14) of the data bus 9.

In the embodiment illustrated the first stage 16 and the intermediate stages 17 are substantially identical. Further, in this embodiment the final stage 18, which is associated with the final column decoder 4(15) and which can connect the group of columns associated therewith to the data line 9(15) of the data bus 9, is slightly different from the preceding stages.

Each of the circuit stages 16, 17 and 18 includes a respective programmable switch 19 which is normally closed. As can be seen from FIG. 3, one terminal of each switch 19 is connected to 0v (VSS) of the supply whereas the other terminal of each switch 19 is connected by way of a resistor 20 to the supply voltage (VDD), for example of 5 volts. Furthermore, for the purpose of this discussion, a high voltage level signal represents a logical "one", whilst a low level signal represents a logical "zero".

Consider the case where the RAM array 1 has been tested and one group of columns has been identified to contain one or more defects. The normally closed switch 19 in the stage 16, 17 or 18 associated with that defective group of columns is then moved to the open position. It will be seen that this will put a logical "one" on the input of a NOR gate 21 connected to the respective switch 19. The output of the NOR gate 21 is connected to a first transistor 22, and by way of an inverter 23 to a second transistor 24. It will be seen that in each stage, the first transistor 22 is connected to the respective column decoder and to the respective line of the data bus 9, whereas the second transistor 24, which is also connected to the respective line of the data bus, is connected to the column decoder associated with the adjacent group of columns preceding, or to the right as seen in FIG. 3. Thus, if we look at the first stage 16, it will be seen that the second transistor 24 is connected to the spare column decoder 15. Similarly, the second transistor 24 of the adjacent intermediate stage 17 will be connected to the column decoder 4(0) whereas the second transistor of the next intermediate stage to the left will be connected to the column decoder 4(1) and so on. This cascaded, serial connection continues through all the logic circuits such that the second transistor 24 of the last stage 18 is connected to the column decoder 4(14) of the immediately adjacent preceding group of columns.

If, after testing, the memory array 1 is found to contain no defects all of the switches 19 remain in their normally closed position. If we look first at the first stage 16 we will see that the closed switch 19 puts a logical "zero" onto one input of the NOR gate 21 such that a logical "one" appears at its output. This logical "one" is applied to the gate of the first transistor 22 which is rendered conductive and thus connects the column decoder 4(0) to the respective line 9(0) of the data bus 9. In addition, the logical "one" output of the NOR gate 21 is applied by way of the inverter 23 to the gate of the second transistor 24 which is thus turned off. This situation will appear in all of the stages 16, 17 and 18 as all of the switches 19 are closed and it will thus be seen that each group of columns is connected by way of its respective decoder 4 and by way of the first transistor 22 of the associated logic circuit stage to the data bus 9. In this respect, it will be seen that in the last stage 18 the NOR gate 21 has been replaced by an inverter 25 but the result is clearly the same.

Let us now consider that when the array 1 is tested, one group of columns is found to contain one or more defects. Let us further consider initially that the defective group is the first group of columns associated with the column decoder 4(0). Because defects are found in this first group of columns the normally closed switch 19 in the associated first stage 16 is opened. Thus, the input from the switch 19 to the NOR gate 21 becomes "one" such that the output of the NDR gate 21 is "zero". This "zero" is applied to the gate of the first transistor 22 which is switched off thereby. Thus, connection of the column decoder 4(0) to the data line 9(0) by way of the first transistor 22 of the first stage is prevented. The inverter 23 puts a "one" onto the gate of the second transistor 24 of the first stage 16 and this is effective to turn on this transistor such that the line 9(0) of the data bus is connected not to the column decoder 4(0) but to the spare column decoder 15 and hence to the spare group of columns. The change in the status of the switch 19 of the first stage 16 does not bring about any change in any of the succeeding circuit stages, that is those to the left as shown in FIG. 3, such that each of those stages connects the associated group of columns to the associated line of the data bus. Thus, the change of state of the switch 19 of the first stage is effective to inhibit access to the first group of columns of the main array 1 but to enable access by way of the spare column decoder 15 to the spare group of columns. Thus, the spare group of columns has effectively replaced the first defective group of columns.

From consideration of FIG. 1 will be apparent that as far as the processor or other control means used with the memory circuit is concerned, the memory array 1 "looks" substantially the same as if the spare columns were not in use, and no program changes are necessary to gain access to the spare columns.

As described above, the first group of columns connected by way of the decoder 4(0) was considered to be defective and was replaced by the spare group of columns 14. Let us now consider the effect if a different group of columns is found to be defective.

Thus, let us consider that one of the groups of columns connected to a one of the intermediate stage 17 is found to be defective. In this case, the switch 19 associated with that stage is opened to apply a logical "one" to one of the inputs of the associated NOR gate 21. As previously, this has no effect on any succeeding stages 17 and 18 to the left, and the groups of columns associated with those stages remain connected to the respective lines of the data bus 9. The group of columns which has been found to be defective is isolated from the data bus as the first transistor 22 of the respective intermediate stage 17 is switched off when the respective switch 19 is opened. Similarly, the second transistor 24 of the respective stage is rendered conductive and it will be seen that this connects the column decoder of the preceding adjacent group of columns to the data bus. However, this adjacent group of columns is connected not to the respective line of the data bus but to the line of the data bus associated with the defective group of columns. Thus, the defective group of columns has effectively been replaced by the immediately preceding adjacent group of columns.

Furthermore, in the stage 17 associated with the defective group, the "one" output from the inverter 23 which has been effective to turn on the associated second transistor is also fed by way of a line 26 to the second input of the NOR gate 21 of the preceding stage, that is, the next stage to the right in FIG. 3. This causes the first transistor 22 in that next stage to be turned off such that the group of columns which has already been connected to the data line associated with the defective group is not connected to its respective data line.

This cascade or serial connection continues through all of the preceding stages (to the right) of the stage associated with the defective group of columns such that each column decoder is connected to the data line associated with the succeeding stage immediately to its left. In the first stage, the spare columns are connected to the data line 9(0) substantially as previously.

It will be appreciated that where the defective group of columns is any group other than the first group at the right hand edge of the array, the group of columns is replaced, not by the spare memory columns, but by the next preceding group of columns, that is by the columns immediately adjacent the defective group to the right. As the replacement group of columns is then connected to the data line associated with the succeeding group of columns, this replacement group is then in turn replaced by the next preceding group of columns and this concatenation of replacement continues until the first group of columns which is, in its turn, replaced by the spare group.

This serial or chain connection in which each group of columns is effectively replaced by the next preceding group of columns is important because it enables the memory array, even where the spare columns are used, to "look" to the processor substantially the same and it enables the program to be run without any change in addresses being necessary. In particular, there should be no increase in the access time of the memory array even when the spare columns are being used.

In the description above it has been stated that the memory has 16×4 columns which are arranged in groups of four with respective 1 from 4 decoders. Of course, the memory can be any suitable number of bits wide and these can be grouped as required. Thus, in general, the memory can be N×P bits wide, being effectively divided into N groups of P columns. Each group of columns will then have a 1 from P column decoder associated therewith. The spare group of columns will similarly be P columns wide and have a 1 from P spare column decoder.

Figure 4:
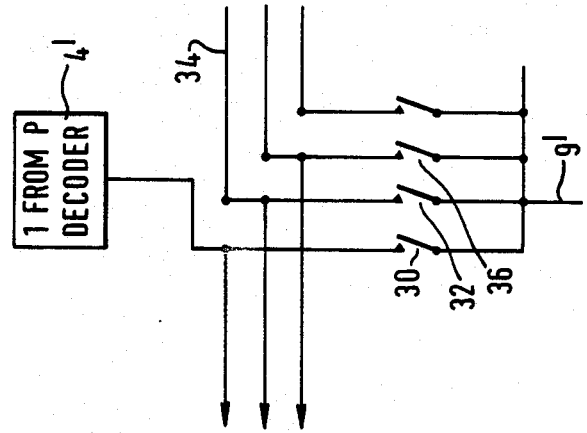
FIG. 4 shows schematically how the logic means of FIG. 3 might be extended to enable more of the memory array to be repaired.

Furthermore, it is possible to extend the present invention such that more than one group of columns can be replaced. This is indicated schematically in FIG. 4 which shows one group of P columns of the memory connected to the associated 1 from P decoder 4'. This decoder 4' is connected to the data line 9' by way of a first switch 30 which is equivalent to the first transistor 22 in the embodiment shown in FIG. 3. Thus, this switch 30 is normally closed to enable the columns to be connected to the data bus. However, if this group of columns is found to be defective, the switch 30 is opened to isolate these columns from the data bus. The data line of this stage can be connected by way of a normally open switch 32 to the next preceding group of columns by way of line 34. This neighbouring group of columns will similarly be connected to a neighbouring group by opening its first switch (equivalent to switch 30), and closing its second switch (equivalent to switch 32) in turn.

If more than one group of spare columns are provided, and more than one group of columns in the main array are found to be defective, the group of defective columns nearest to the last stage, that is furthest to the left, is connected to the next preceding stage as described above. Thus, the circuit will have been effective already to open the switch 30 to isolate the group of columns shown in FIG. 4 from the corresponding line 9' of the data bus, and to close the switch 32 to connect this line 9' of the data bus to the next preceding group of columns. However, if this group of columns is also defective switch 32 is then opened and a further switch 36 is closed connecting the data line 9 not to the next preceding group of columns but to the group adjacent thereto. This switching is effective through all the stages up to the first stage such that two spare groups of memory columns are used in place of the two defective groups.

In the Figures the fact that a group of columns contains defects is registered by opening or closing switches which may be programmable switches such as transistors, or may be fuses which can be blown or not blown during testing such that the state of the switch is frozen. In FIG. 3, the switches connecting the groups of columns to the relevant data lines are shown as transistors but other sorts of switches may be employed.

It will be appreciated from the above that the present invention enables column redundancy to be implemented in wide RAMS without requiring an unreasonable increase in silicon area and with no noticeable access time penalty. Although the invention can be implemented in memories of any width, it is probably most efficient in wide memories, that is in memories which are 8 or more bits wide.

The invention has been described above as providing redundancy for RAM. However, the invention is clearly applicable to any memory array in which data can be written and thus might be used with erasable programmable read-only memory (EPROM).

I claim:

1. A memory circuit comprising:
   a memory array having a plurality of individual elements arranged in a matrix to define a plurality of rows and a plurality of columns, wherein said columns are arranged to form a plurality of first columns groups, each column being assigned to a selected one of said first column groups;
   a plurality of first column decoders for enabling access to said array, each of said first column decoders being associated with a respective one of said first column groups and being arranged to access selectively any one of the columns in said associated column group;
   a plurality of further memory elements arranged to define a plurality of further columns arranged to form a spare column group;
   a further column decoder associated with and arranged to enable access to said spare column group, said further column decoder being arranged to access selectively any one of the columns in said spare column group;

a plurality of data lines, each data line being associated with a respective one of said first column groups; and programmable logic means for coupling each of said first column groups to its associated data line by way of the associated first column decoder;

wherein said logic means can be actuated to inhibit access to a selected one of said first column groups and to enable access to said spare column group, said logic means isolating said selelcted first column group from its associated data line and concurrently coupling said spare column group to one of said data lines.

2. The memory circuit according to claim 1, wherein said logic means is for coupling the data line isolated from said selected first column group either to said spare column group or to a further one of said first column groups, and wherein, when said isolated data line is coupled to a further one of said first column groups, said logic means being arranged to selectively de-couple further first column groups from their associated data lines, and to concurrently couple said further first column groups and said spare column group to the de-coupled data lines, each of said first column groups, except said selected first column group, and said spare column group being coupled individually to a single respective data line.

3. The memory circuit according to claim 1, wherein each of said first column groups includes an identical number of columns, and wherein the number of columns in said spare column group is equal to the number of columns in each of said first column groups.

4. A memory circuit comprising:

a plurality of individual storage elements arranged in an array to define a plurality of rows and a plurality of columns, wherein said columns are arranged to form a plurality of first column groups, each column being assigned to a selected one of said first column-groups;

a plurality of first column decoders for enabling access to said array, each of said first column decoders being associated with a respective one of said first column groups and being arranged to selectively access any one of the columns in said associated column group;

a plurality of further storage elemenets arranged to define a plurality of further columns arranged to form a spare column group;

a further column decoder associated with and arranged to enable access to said spare column group, said further column decoder being arranged to selectively access any one of the columns in said spare column group;

a plurality of data lines, each data line being associated with a respective one of said first column groups; and programmable logic means for coupling each of said first column groups to its associated data line by way of the associated first column decoder;

wherein said logic means has a respective logic circuit associated with each of said first column groups, each logic circuit comprising first programmable switch means for coupling the associated first column group to a respective data line, and second programmable switch means for coupling said data line to a different first column group or to said spare column group, and wherein said first switch means is arranged for coupling the associated first column decoder and the respective data line, and the second switch means is arranged for coupling said respective data line and a different first column decoder or said further column decoder.

5. In a memory circuit comprising a memory array having a plurality of individual elements arranged in a matrix to define a plurality of rows and a plurality of columns, said columns being arranged to form a plurality of first column groups, each said column being assigned to a selected one of said first column groups; a plurality first column decoders for enabling access to said array, each of said first column decoders being associated with a respective one of said first column groups and being arranged to access selectively any one of said columns in said associated column group; a plurality of further memory elements arranged to define a plurality of further columns arranged to form a spare column group, and a further column decoder associated with and arranged to enable access to said spare column group, said further column decoder being arranged to access selectively any one of said columns in said spare column group; and a plurality of data lines, each data line being associated with a respective one of said first column groups; a method for replacing one of said first column groups by said spare column group and comprising the steps of:

isolating a selected one of said first column groups from its associated data line to inhibit access to said selected first column group;

concurrently coupling said spare column group to one of said data lines such that said spare column group is accessed;

coupling the data line isolated from said selected first column group either to said spare column group or to a further one of said first column groups, and when said isolated data line is coupled to a further one of said first column groups, selectively de-coupling further first column groups from their associated data lines, and concurrently coupling said further first column groups and said spare column groups to the de-coupled data lines such that the spare column group and each of said first column groups, except the selected first column, are individually coupled to a single respective data line.

6. A method according to claim 5, wherein said isolated data lines is coupled to the first column group adjacent to and preceding said selected first column group, the spare column group constituting the column group adjacent to and preceding the first one of the first column groups.

7. The memory circuit according to claim 2, wherein said logic means is arranged for coupling said isolated data line to the adjacent preceding first column group, the spare column group constituting the column group adjacent to and preceding the first one of the first column groups.

8. The memory circuit according to claim 7, wherein said spare column group is physically adjacent to the first one of the first column groups.

9. The memory circuit according to claim 3, wherein each row of the memory array is arranged to store more than one data word, the same data bit of every data word being stored in the same column group.

10. The memory circuit according to claim 9, wherein the number of columns in each column group is equal to the number of data words to be stored in each row, and the number of column groups is equal to the number of data bits making up each data word.

11. The memory circuit according to claim 10, wherein correspondingly positioned bits of each data word are stored in each column group.

12. The memory circuit according to claim 1, wherein said logic means has a respective logic circuit associated with each of said first column groups, each logic circuit comprising first programmable switch means for coupling the associated first column group to a respective data line, and second programmable switch means for coupling said data line to a different first column group or to said spare column group.

13. The memory circuit according to claim 12, wherein said first switch means is arranged for coupling the associated first column decoder and the respective data line, and the second switch means is arranged for coupling said respective data line and a different first column decoder or said further column decoder.

14. The memroy circuit according to claim 12, wherein said second switch means is arranged for coupling said respective data line to the column decoder associated with the adjacent preceding column group, the spare column group constituting the column group adjacent to and preceding the first one of the first column groups.

15. The memory circuit according to claim 12, wherein each said logic circuit includes a further programmable switch means for controlling said first and second switch means.

16. The memory circuit according to claim 15, wherein said further switch means normally controls the first switch means to couple the associated first column group to said respective data line, and normally controls the second switch means to isolate said respective data line from other column groups.

17. The memory circuit according to claim 16, wherein said further programmable switch means is a normally closed switch.

18. The memory circuit according to claim 17, wherein said further programmable switch means is a fuse.

19. The memory circuit according to claim 17, wherein said further switch means is arranged to be opened for indicating that the associated first column group contains one or more defects.

20. The memory circuit according to claim 15, wherein the further progrommable switch means of each logic circuit is also arranged for controlling the condition of said first and second switch means of the next logic circuit associated with the adjacent preceding first column group.

21. The memory circuit according to claim 15, 16, 17, 18, 19 or 20, wherein the first and second switch means of each logic circuit are first and second transistors whose gates are connected to said further switch means, the gate of one of said transistors being coupled to said switch means by way of an inverter.

22. The memory circuit according to claim 12, wherein additional programmable switch means are provided in each of said logic circuits for coupling each data line to further column groups.

23. The memory circuit according to claim 22, wherein a plurality of spare column groups are provided, each spare column group having an associated further column decoder.

24. The method according to claim 6, further comprising coupling any first column group whose respective data line has been coupled to the succeeding column group to the data line of the adjacent preceding column group, the data line of the first one of the first column groups being coupled to said spare column group, such that each data line is only coupled to one column group.

25. The method according to claim 6, wherein two or more spare column groups are provided, and further comprising coupling any first column group whose respective data line has been coupled to the succeeding column group to the data line of a preceding column group, the data line of the first one of the first column groups being coupled to one of said spare column groups such that each data line is only coupled to one column group.

26. The method according to claim 25, wherein access to a plurality of selected first column groups is inhibited by isolating each said selected column group from its respective data line, the number of isolated selected column groups being less than or equal to the number of spare column groups.

* * * * *